(12) United States Patent
Tanaka et al.

(10) Patent No.: US 10,749,126 B2
(45) Date of Patent: Aug. 18, 2020

(54) METHOD FOR MANUFACTURING FLEXIBLE ELECTRONIC DEVICE

(71) Applicant: HON HAI PRECISION INDUSTRY CO., LTD., New Taipei (TW)

(72) Inventors: Kohichi Tanaka, Osaka (JP); Yozo Narutaki, Osaka (JP); Katsuhiko Kishimoto, Osaka (JP)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 9 days.

(21) Appl. No.: 16/083,854

(22) PCT Filed: Jul. 26, 2016

(86) PCT No.: PCT/JP2016/071857
§ 371 (c)(1),
(2) Date: Sep. 10, 2018

(87) PCT Pub. No.: WO2017/154235
PCT Pub. Date: Sep. 14, 2017

(65) Prior Publication Data
US 2019/0067605 A1    Feb. 28, 2019

(30) Foreign Application Priority Data

Mar. 10, 2016 (JP) ................................. 2016-046815

(51) Int. Cl.
*H01L 51/00* (2006.01)
*H01L 21/683* (2006.01)
(Continued)

(52) U.S. Cl.
CPC ...... *H01L 51/0097* (2013.01); *H01L 21/6835* (2013.01); *H01L 51/003* (2013.01);
(Continued)

(58) Field of Classification Search
CPC ............... H01L 51/0097; H01L 51/003; H01L 51/5203; H01L 21/6835
See application file for complete search history.

(56) References Cited

U.S. PATENT DOCUMENTS

| 2011/0194063 | A1 | 8/2011 | Lee et al. |
| 2014/0093988 | A1 | 4/2014 | Kawata |
| 2014/0353638 | A1* | 12/2014 | Kawata ................. H01L 27/322 257/40 |

FOREIGN PATENT DOCUMENTS

| JP | 2007-087807 A | 4/2007 |
| JP | 2011-164569 A | 8/2011 |

(Continued)

*Primary Examiner* — Matthew L Reames
(74) *Attorney, Agent, or Firm* — ScienBiziP, P.C.

(57) ABSTRACT

A method for manufacturing flexible electronic devices is provided to enable to manufacture the flexible electronic devices without increasing a number of steps, enables to reuse a glass substrate, and reduces the possibility that the flexible electronic devices are damaged or corners of them are not bent even if the detached flexible electronic devices are brought into contact with each other.

Electronic device structures 2 are formed on a resin film substrate 11 formed on a glass substrate 10, and flexible electronic devices including the electronic device structures 2 formed on device formation areas 3 are separated from the resin film substrate 11 by irradiating first laser beams 41 having a longer wavelength along a rectangular shape having rounded corners or chamfers at four corners to each the device formation areas 3, subsequently, an interface between the glass substrate 10 and the resin film substrate 11 is metamorphosed by irradiation of second laser beams 42 having a shorter wavelength to entire surface of the resin film substrate 11 from a back side of the glass substrate 10 so as to make the resin film substrate 11 easy to be peeled off from the glass substrate 10.

5 Claims, 9 Drawing Sheets

(51) Int. Cl.
*H01L 51/52* (2006.01)
*H05K 1/18* (2006.01)
*H01L 23/00* (2006.01)
*H01L 27/32* (2006.01)

(52) U.S. Cl.
CPC ........ *H01L 51/5203* (2013.01); *H01L 51/524* (2013.01); *H05K 1/189* (2013.01); *H01L 23/00* (2013.01); *H01L 24/00* (2013.01); *H01L 27/3241* (2013.01); *H01L 2221/68331* (2013.01); *H01L 2251/5338* (2013.01); *H01L 2251/566* (2013.01); *H01L 2924/12044* (2013.01); *H05K 2201/10128* (2013.01)

(56) References Cited

FOREIGN PATENT DOCUMENTS

| | | |
|---|---|---|
| JP | 2012-209215 A | 10/2012 |
| JP | 2014-048619 A | 3/2014 |
| JP | 2014-074757 A | 4/2014 |

\* cited by examiner

METHOD FOR MANUFACTURING FLEXIBLE ELECTRONIC DEVICE

TECHNICAL FIELD

The present invention relates to a method of manufacturing flexible electronic devices such as image display devices using organic light emitting diodes.

BACKGROUND ART

In recent years, an image display device in which an organic light emitting diode (OLED: organic light emitting diode) is formed on a resin film substrate having flexibility has been put to practical use. When a flexible electronic device such as an image display device is formed on such a flexible resin film substrate, it is necessary to hold the resin film substrate flat. Therefore, generally, a thermosetting resin such as a polyimide precursor is coated on a flat glass substrate and further cured at a certain temperature to form a resin film substrate such as polyimide held on the glass substrate. Then, subsequent to forming a circuit element for driving the organic light emitting diode on the resin film substrate held on the glass substrate, it is carried into a vapor deposition apparatus to form an organic light emitting diode structure such as reflective electrodes (anodes), a hole injection layer, a hole transport layer, light emitting layers, an electron transport layer, an electron injection layer, and extremely thin metal electrodes (cathodes) having translucency by vapor deposition. Then, after forming an electronic device structure comprising a driving circuit and the organic light emitting diode structure on the resin film substrate, second laser beams having a shorter wavelength such as ultraviolet rays are irradiated to metamorphose the interface between the glass substrate and the resin film from the back side of the glass substrate, that is, from the side where the resin film substrate is not formed, for making it easy to separate the resin film substrate from the glass substrate. Furthermore, first laser beams having a longer wavelength such as infrared rays are irradiated to circumferences of an area where the electronic device structure is formed from the front side of the glass substrate so as to separate off the flexible electronic device formed on the resin film substrate therefrom. In the case of manufacturing a lot of the flexible electronic devices from a single resin film substrate, vapor deposition materials are deposited so that individual flexible electronic devices are arranged in a matrix shape. Then, when the flexible electronic devices are formed, the first laser beams are linearly scanned along the arrangement direction of each side of the electronic devices to separate the individual flexible electronic devices from the resin film substrate.

As will be described later, since the order of irradiation of the first laser beams and the second laser beams is different from those of the method of manufacturing flexible electronic devices according to the present invention, the laser beams which appear first are referred to as "second laser beams" and the laser beams which appear afterwards are referred to as "first laser beams". The term "electronic device structure" means a structure serving as an electronic device such as a circuit element for driving an organic light emitting diode formed on a resin film substrate and the organic light emitting diode structure which comprises reflective electrodes (anodes) formed on the circuit element, a hole injection layer, a hole transport layer, light emitting layers, an electron transport layer, an electron injecting layer, and metal electrodes (cathodes), and the term "flexible electronic device" means a completed electronic element including the electronic device structure and the resin film substrate surrounding the same (the same applies hereafter).

By the way, in the conventional method for manufacturing flexible electronic devices, since the first laser beams are irradiated over the entire surface of the resin film substrate formed on the glass substrate, the resin film substrate in areas not used for the flexible electronic devices are peeled from the glass substrate, too. Therefore, when the flexible electronic devices together with the glass substrate are conveyed to the next process to connect driver ICs or the like to the manufactured flexible electronic devices, the glass substrate must be carefully handled so as not to drop the flexible electronic devices from the glass substrate. Therefore, according to the manufacturing method of flexible electronic devices described in Patent Literature 1, peeling prevention layers are formed in rectangular frame shapes at circumferences of device formation areas where flexible electronic devices are formed so as to suppress amounts of transmission of first laser beams for peeling the resin film substrate, so that only interfaces of the glass substrate and the resin film substrate in the device formation areas are metamorphosed. Consequently, even when the flexible electronic devices together with the glass substrate are conveyed to the next process, since the resin film substrate at the portions where the peeling prevention layers are formed adheres to the glass substrate and serves as guides, the flexible electronic devices hardly drop from the glass substrate.

In the method for manufacturing flexible electronic devices described in Patent Literature 1, a process for forming the peeling prevention layers at the circumferences of the device formation areas is required, and in the case of reusing the glass substrate, a process for removing the peeling prevention layers from the glass substrate is further required. Consequently, they cause the increase of the manufacturing cost of the flexible electronic device. In addition, in the case of manufacturing a lot of the flexible electronic devices from a single resin film substrate, in order to decrease the manufacturing cost by increasing the utilization efficiency of the members, clearances between individual flexible electronic devices (or device formation areas) tend to be narrower, so that it is impossible to connect flexible printed boards on which driver ICs or the like are disposed to the flexible electronic devices held on the glass substrate, and thus, it is necessary to attach the flexible printed board to the flexible electronic device after removing it from the glass substrate. At that time, since four corners of the individual flexible electronic device are sharpened, the flexible electronic devices may be damaged by the sharp corners when the flexible electronic devices removed from the glass substrate come into contact with each other. Furthermore, since a resin film substrate such as a polyimide film tends to warp due to the influence of water absorbing or the like when it left, if the four corners of the flexible electronic device are sharpened, the corner may be bent when it comes into contact with something.

CITATION LIST

Patent Literatures

Patent Literature 1: JP 2014-48619 A

SUMMARY OF INVENTION

The present invention has been conceived to solve the problems of the above-mentioned background arts and purposed to provide a method for manufacturing flexible electronic devices which enables to manufacture the flexible electronic devices without increasing a number of processes, enables to reuse a glass substrate, and reduces the possibility that the flexible electronic devices are damaged or corners of them are not bent even if the detached flexible electronic devices are brought into contact with each other.

In order to achieve the above-mentioned purposes, a method for manufacturing flexible electronic devices according to the present invention comprises:

a step for forming a resin film substrate on a glass substrate by coating a thermosetting resin on a surface of the glass substrate and curing the thermosetting resin;

a step for forming electronic device structures in device formation areas arranged as a matrix shape on the resin film substrate;

a step for irradiating first laser beams having a longer wavelength along rectangular shapes having round corners or chamfers formed at four corners to the device formation areas so as to separate flexible electronic devices including the electronic device structures formed in the device formation areas from other areas of the resin film substrate; and a step for irradiating second laser beams having a shorter wavelength from a side of the glass substrate where the resin film substrate is not formed so as to metamorphose an interface of the glass substrate and the resin film substrate and to make the resin film substrate easy to peel off from the glass substrate.

The electronic device structures formed in the device formation areas arranged as the matrix shape may be formed in the same direction in a first direction and formed in the same direction every other row so that adjacent two rows are reversed from each other in a second direction.

It may be configured that third laser beams are irradiated to the glass substrate and the resin film substrate for linearly cutting the glass substrate and the resin film substrate linearly in the first direction to cut off the glass substrate and the resin film substrate in a manner so that one row or two rows of the device formation areas arranged in the first direction among the device formation areas arranged in the matrix shape are included in the same piece cut in the second direction prior to irradiation of the first laser beams or subsequent to irradiation of the first beams and prior to irradiation of the second laser beams.

Alternatively, it may be configured that the glass substrate is formed of an arrangement of a plurality of strip-shaped pieces having a dimension in the second direction sufficient to form one or two of the device formation areas in the same direction, and a dimension in the first direction longer than that in the second direction, and when irradiating the first laser beams, the first laser beams are linearly irradiated in the first direction along contact faces of two of the strip-shaped pieces adjacent to each other in the second direction so as to cut the device formation areas arranged in the first direction on the resin film substrate every other rows or every other two rows adjacent in the second direction.

It may be configured that other electronic elements are respectively connected to the flexible electronic devices arranged in the first direction on the resin film substrate and cut every other row or every other two rows adjacent in the second direction, and the second laser beams are irradiated subsequently.

It may be configured that holes or notches corresponding to shapes of other electronic elements are formed at positions that interfere with the other electronic elements according to the electronic devices in which the flexible electronic devices are used, when irradiating the first laser beams.

According to the method for manufacturing the flexible electronic devices of the present invention, since devices formed in the device formation areas are separated from other areas of the resin film substrate by irradiation of the first laser beams having a longer wavelength such as infrared to the resin film substrate prior to irradiation of the second laser beams having a shorter wavelength such as ultraviolet to metamorphose the interface between the glass substrate and the resin film substrate, and by delaying the timing for irradiating the second laser beams, it is possible to connect other electronic elements such as driver ICs to the flexible electronic devices while holding a plurality of the flexible electronic devices on the glass substrate. In addition, since the second laser beams are irradiated to entire surface of the resin film substrate, the resin film substrate can easily be removed from the glass substrate, and the glass substrate can be reused easily. Furthermore, since the first laser beams having a longer wavelength are irradiated along a rectangular shape with rounded corners or chamfers at four corners to the device formation areas respectively, the four corners of the completed flexible electronic devices are not sharpened, and thus, the possibility that the flexible electronic devices are damaged or corners of them are not bent even if the flexible electronic devices are brought into contact with each other is reduced.

DESCRIPTION OF INVENTION

Figure 1:
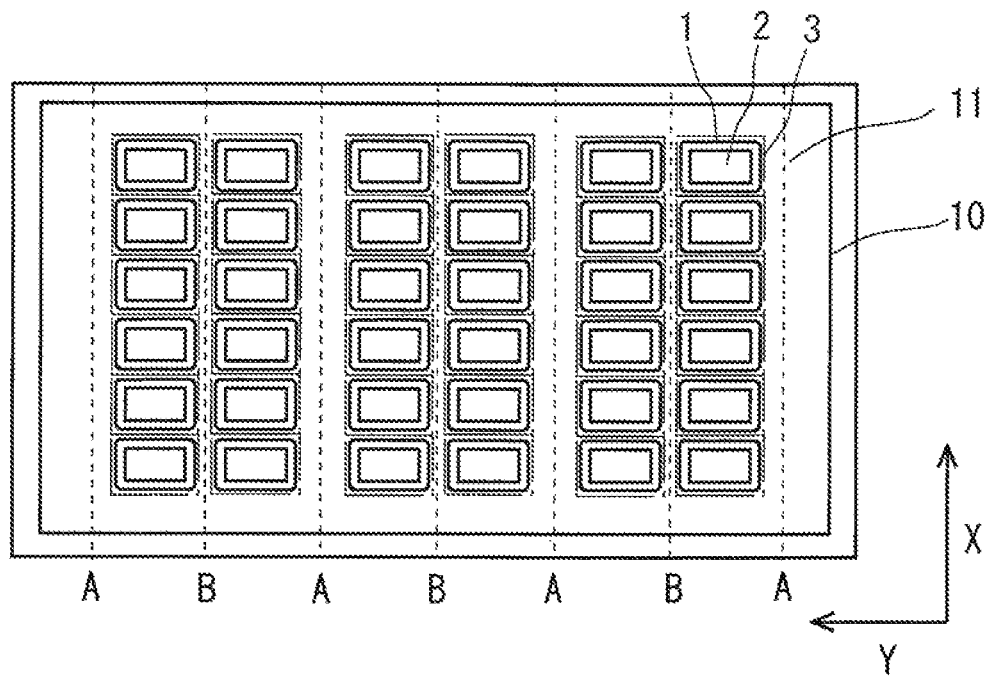
FIG. 1 is a view showing an appearance that flexible electronic devices are formed and arranged as a matrix shape on a resin film substrate which is formed on a glass substrate by a method for flexible electronic devices according to an embodiment of the present invention.
Figure 2A:
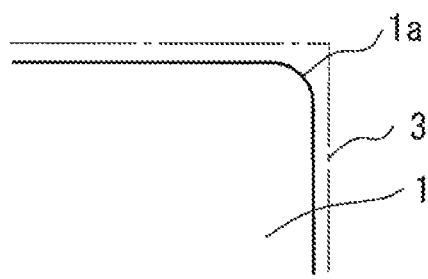
FIG. 2A is a view showing a round corner formed at four corners of the flexible electronic device.
Figure 2B:
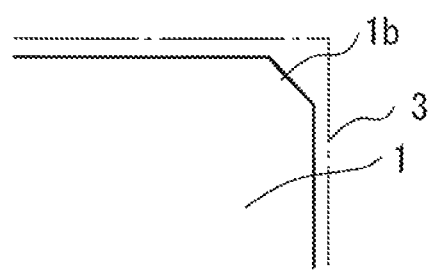
FIG. 2B is a chamfer formed at four corners of the flexible electronic device.

A method for manufacturing flexible electronic devices according to an embodiment of the present invention is described. FIG. 1 shows an appearance that a resin film substrate 11 made of polyimide or the like is formed on a glass substrate 10, a plurality of flexible electronic devices 1 and device formation areas 3 are arranged as a matrix shape on the resin film substrate 11, and electronic device structures 2 are respectively formed on manufactured individual flexible electronic devices 1. Rounded corners 1a shown in FIG. 2A or chamfers 1b shown in FIG. 2B are formed at four corners of the flexible electronic devices 1. In is preferable that a radius of curvature of the rounded corners 1a are in a range from 1 mm to 10 mm, for example. In addition, although each of the device formation areas 3 substantially coincides with the outer shape of the flexible electronic device 1, it is a virtual area of a rectangular shape having no round corner or chamfer at four corners and set out to be arranged as the matrix shape on the resin film substrate 11.

Figure 3:
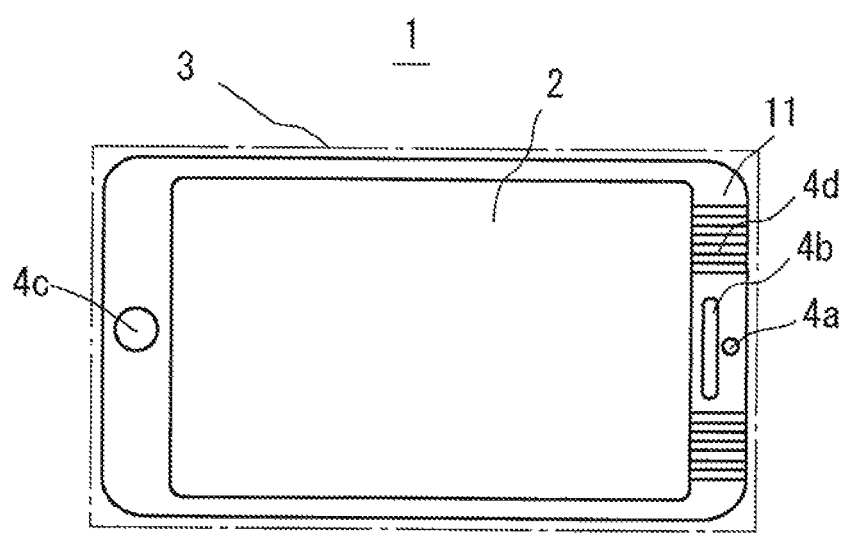
FIG. 3 is a view showing an example of an outer shape of the flexible electronic device.

FIG. 3 shows an image display device using an organic light emitting diode which is used in a smartphone as an example of the flexible electronic devices 1 formed on the resin film substrate 11. In addition, the device formation area 3 is shown by one dotted chain line. Such an image display device is so-called top-emission type one, and a circuit element for driving the organic light emitting diode, reflection electrodes (anodes) formed on the circuit element, a hole injection layer, a hole transporting layer, light emitting layers, an electron transporting layer, an electron injection layer, and semi-transparent very thin metal electrodes (cathodes) and so on are laminated as the electronic device structure on the resin film substrate 11 which is not necessarily transparent. The outer shape of the resin film substrate 11 of the flexible electronic device 1 corresponds to an outer shape of an electronic device to which this image display device is used, and the electronic device structure 2 is formed in a central portion of the device formation area 3 of the resin film substrate 11. In addition, in circumferences of the electronic device structure 2 on the resin film substrate 11, holes or notches 4a to 4c corresponding to other electronic elements are formed at positions interfering with other electronic elements such as a taking lens, a speaker, a microphone and so on. Furthermore, in the circumferences of the electronic device structure 2, conductive patterns 4d which will be connected to a driver IC for driving the electronic device structure 2 or the like are formed.

Figure 4A:
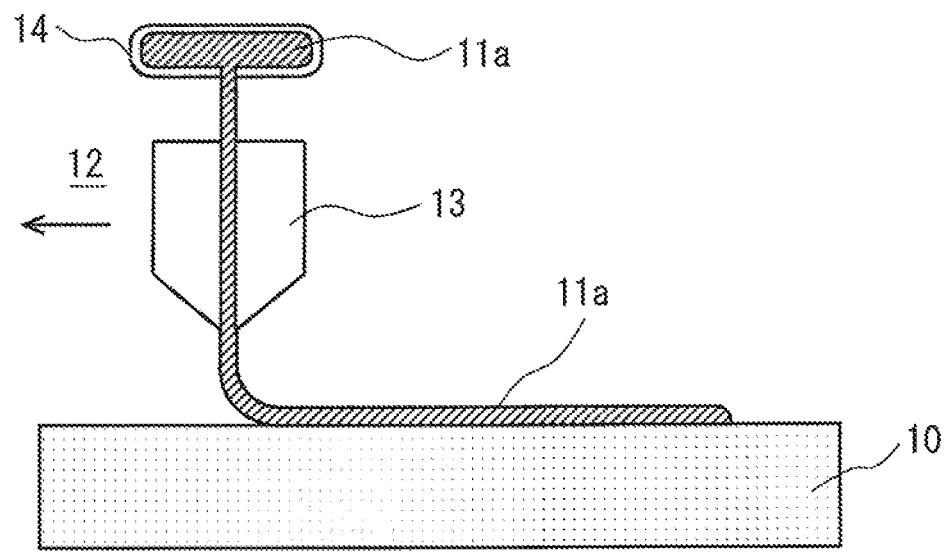
FIGS. 4A and 4B are views showing processes for forming a resin film substrate on a glass substrate.
Figure 4B:
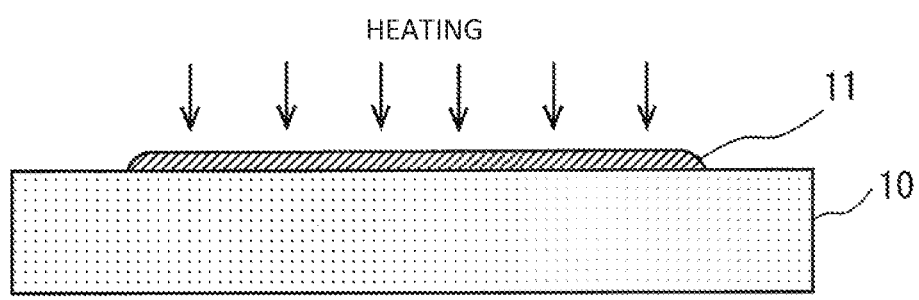

FIGS. 4A and 4B show processes for forming the resin film on the glass substrate. In FIG. 4A, a coating applicator 12 which is generally called slit-coater comprises a slit head 13 moved in parallel with a coating target surface of the glass substrate 10 and a pump 14 for supplying a resin material 11a to the slit head 13, so that the resin material 11a is supplied to an upper surface of the glass substrate 10 with a coating width corresponding to a length of the slit head 13. The resin material 11a is a thermosetting resin such as a polyimide precursor and cured at 400 to 500 degrees Celsius for several hours, for example. Meanwhile, since the solvent component vaporizes and bonding of the molecules proceeds, as shown in FIG. 4B, a thickness of the resin film substrate 11 such as polyimide formed on the glass substrate 10 substantially depends on a density of a solvent, and it will be about 1/10 of the thickness of the resin material 11a coated on the coating target surface of the glass substrate 10, for example. Therefore, an amount and a density of the resin material 11a to be coated on the coating target surface of the glass substrate 10 are adjusted corresponding to a desired thickness of the resin film substrate 11. In addition, coating method of the resin material 11a is not limited to the method using the slit-coater, and other coating apparatus such as a wire-bar-coater, a spin-coater, or the like may be used. The thickness of the resin film substrate 11 after curing is generally about 10 μm to several tens μm.

Figure 5:
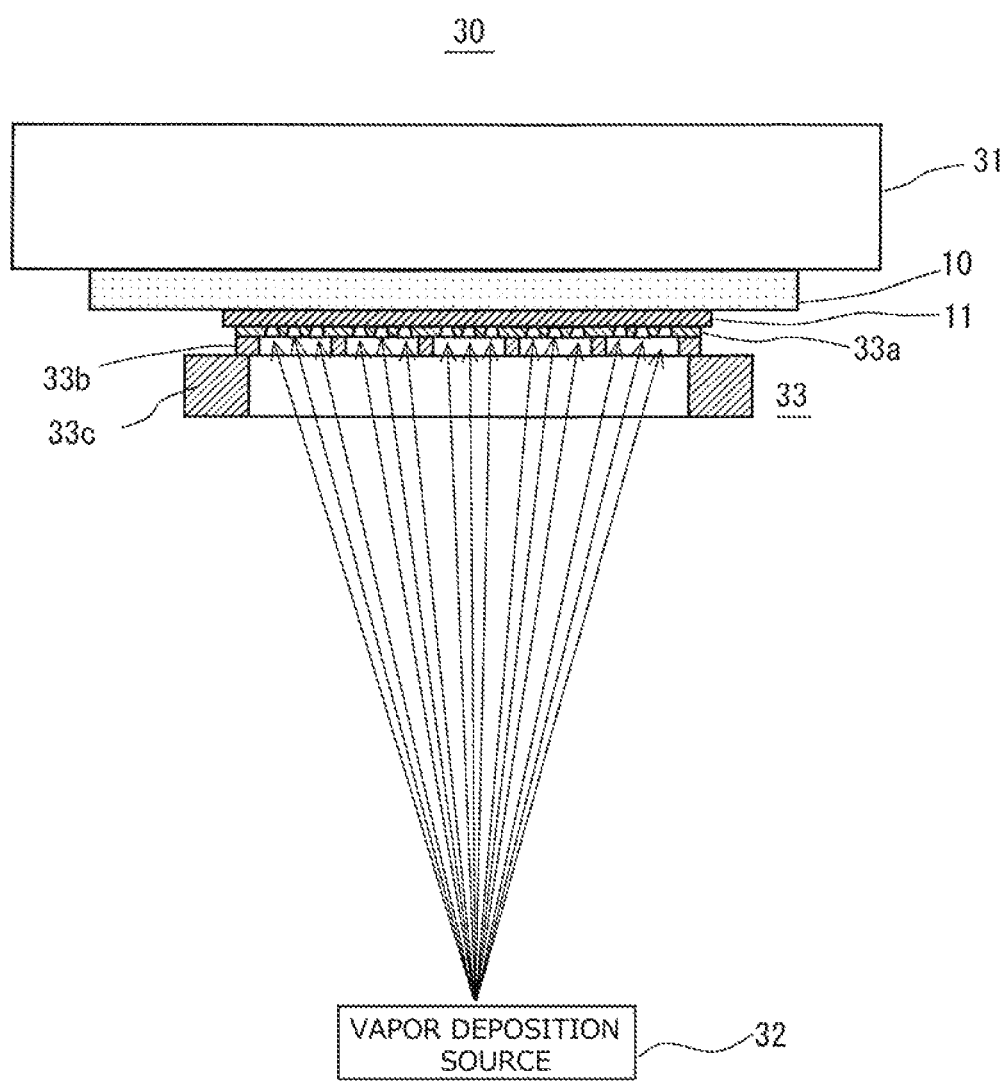
FIG. 5 is a view showing a process for forming organic light emitting diode structures on the resin film substrate by vapor deposition.

FIG. 5 shows a configuration and vapor deposition process of a vapor deposition apparatus 30 for manufacturing the organic light emitting diode structures which constitute the electronic device structures 2 on the resin film substrate 11. In a vacuum chamber (not shown), the vapor deposition apparatus 30 comprises a substrate holder 31 for holding the resin film substrate 11 so that a surface serving as a vapor deposition target surface faces downward, a plurality of point-like or linear vapor deposition sources 32 provided so as to face the vapor deposition target surface of the resin film substrate 11 held on the substrate holder 31 in a bottom portion in a vacuum chamber, and a driving mechanism (not shown) for rotating or translating the substrate holder 31 or the vapor deposition sources 32 at a constant speed in a predetermined direction. Vapor deposition materials for forming the above-mentioned reflection electrodes (anodes), the hole injection layer, the hole transporting layer, the light emitting layers, the electron transporting layer, the metal electrodes (cathodes), and so on are contained in a plurality of the vapor deposition sources. When the resin film substrate 11 is formed on the glass substrate 10, the glass substrate 10 is mounted on the substrate holder 31 so as to face the resin film substrate 11 downward. Subsequently, a vapor deposition mask 33 is attached thereto from below, and the vapor deposition is started.

The vapor deposition mask 33 which is so-called a hybrid-type one comprises a resin film layer 33a in which openings are formed as a predetermined pattern, a metal film layer 33b for holding the resin film layer 33a, and a metal frame 33c for applying a constant tension to the resin film layer 33a. In addition, since patterns of the reflection electrodes (anodes), the hole injection layer, the hole transporting layer, the light emitting layers, the electron transporting layer, the metal electrodes (cathodes) are different from each other, so that vapor deposition masks corresponding to respective layers are provided and the vapor deposition processes are carried out with changing the vapor deposition masks. Furthermore, positions of the light emitting layers of red (R), green (G) and blue (B) which configures a single image are different, so that processes for forming the light emitting layers are repeated three times with changing the vapor deposition masks. The vapor deposition mask 33 is attracted to and held on the vapor deposition target surface of the resin film substrate 11 by magnetic force of a magnet provided inside the substrate holder 31, for example.

Figure 6A:
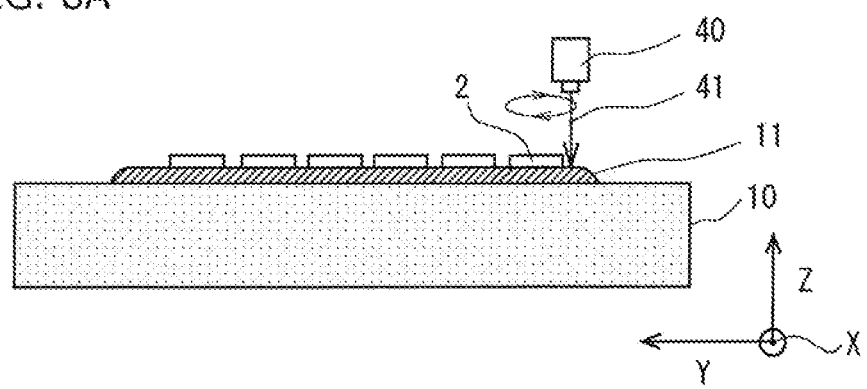
FIGS. 6A to 6C are views showing processes for separating the flexible electronic devices formed on the resin film substrate from other areas of the resin film substrate and to metamorphose an interface between the glass substrate and the resin film substrate.
Figure 6B:
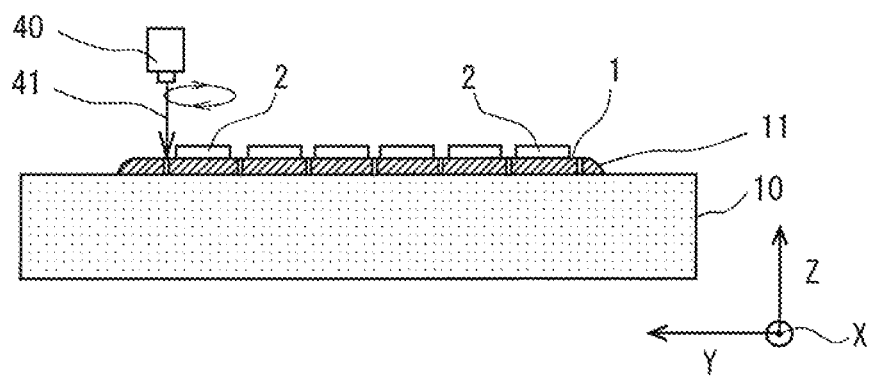
Figure 6C:
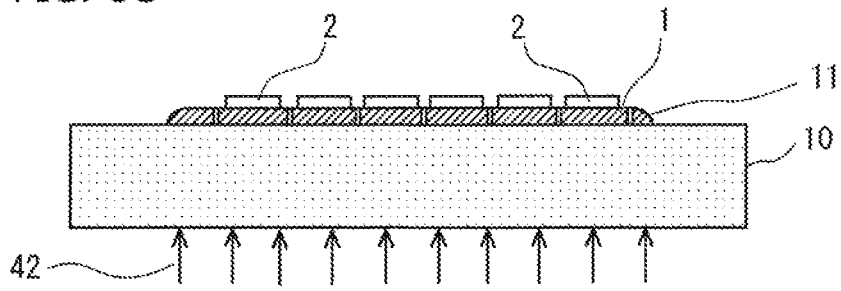

First, the circuit elements for driving the organic light emitting diodes are formed on the resin film substrate 11. Subsequently, when the image display devices as the electronic device structures 2 comprising the organic light emitting diodes are formed on the circuit elements with using the vapor deposition device 30, the resin film substrate 11 together with the glass substrate 10 is removed from the vapor deposition apparatus 30 and a top and a bottom are reversed so that the electronic device structures 2 face upward, sealing films and so on are formed on the electronic device structures 2, and the flexible electronic devices 1 are cut off from the resin film substrate 11. FIGS. 6A to 6C show an apparatus and processes for separating the flexible electronic devices 1 respectively from other areas of the resin film substrate 11 and for metamorphosing the interface between the glass substrate 10 and the film resin substrate 11, and FIG. 6A shows start of separation process and FIG. 6B shows end of the separation process. A first laser apparatus 40 irradiates first laser beams 41 having a longer wavelength such as infrared and attached to an X-Y table (not shown) provided above the resin film substrate 11 and the glass substrate 10. Then, when assuming a direction perpendicular to the paper sheet of the drawings is defined X, a horizontal direction is defined Y and a vertical direction is defined Z, the first laser apparatus 40 is configured freely movable in X-Y plane by the X-Y table. In this embodiment, the first laser apparatus 40 is moved along the outer shape line of the flexible electronic device shown in FIG. 1 while irradiating the first laser beams 41 to the device formation areas 3, respectively. In doing so, as shown in FIG. 2A or 2B, the rounded corners or chamfers are formed at four corners of the flexible electronic devices 1. At this stage, although the flexible electronic devices 1 are respectively separated from the other areas of the resin film substrate 11, second laser beams which will be described later are not irradiated yet, so that the flexible electronic devices 1 are respectively held on the glass substrate 10.

FIG. 6C shows a process to metamorphose the interface between the glass substrate 10 and the resin film substrate 11 by irradiating the second laser beams 42 having a shorter wavelength such as ultraviolet by a second laser apparatus (not shown) from the back side of the glass substrate 10, that is, the side where the resin film substrate 11 is not formed. The second laser beams 42 are irradiated to substantially entire area of the back surface of the glass substrate 10 so as to remove the entire of the film resin substrate 11 from the glass substrate 10. Thereby, since the individual flexible electronic devices 1 has been separated from the resin film substrate 11 or the other areas, the flexible electronic devices 1 can be removed from the glass substrate 10 one by one and translocate to a conveyance tray or the like. As mentioned above, since the rounded corners or chamfers are firmed at four corners of the flexible electronic devices 1, and the corners of the flexible electronic devices 1 are not sharpened, the possibility that the flexible electronic devices 1 are damaged is reduced, even if the flexible electronic devices 1 are contacted with each other. In addition, although the resin film substrate 11 of polyimide or the like tends to warp if it is left, since the four corners of the flexible electronic device are not sharpened, the possibility that corners of the flexible electronic devices are not bent even if it is brought into contact with anything. Furthermore, since entire of the resin film substrate 11 is removed from the glass substrate 10 by irradiating the second laser beams 42 to entire of the resin film substrate 11 on the glass substrate 10, the glass substrate 10 can be reused.

Figure 7:
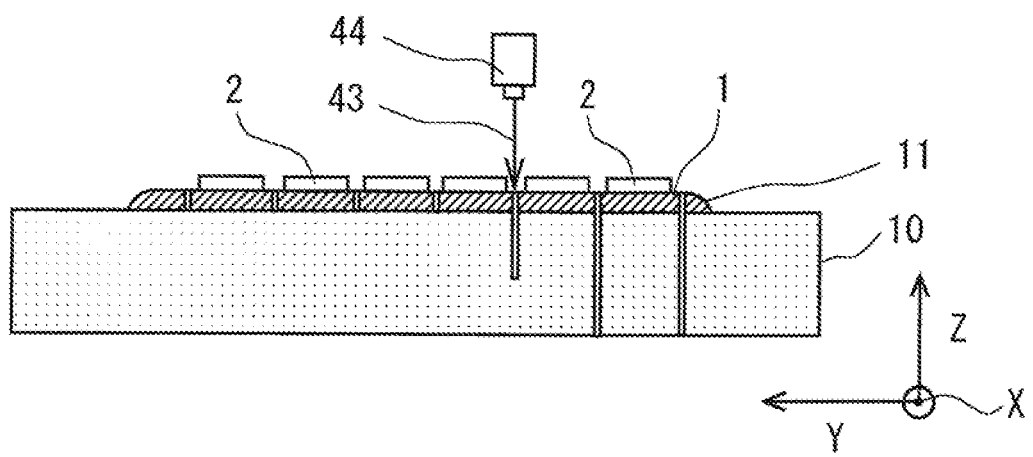
FIG. 7 is a view showing a process for cutting the glass substrate in a first modification of the method for manufacturing flexible electronic devices.
Figure 8:
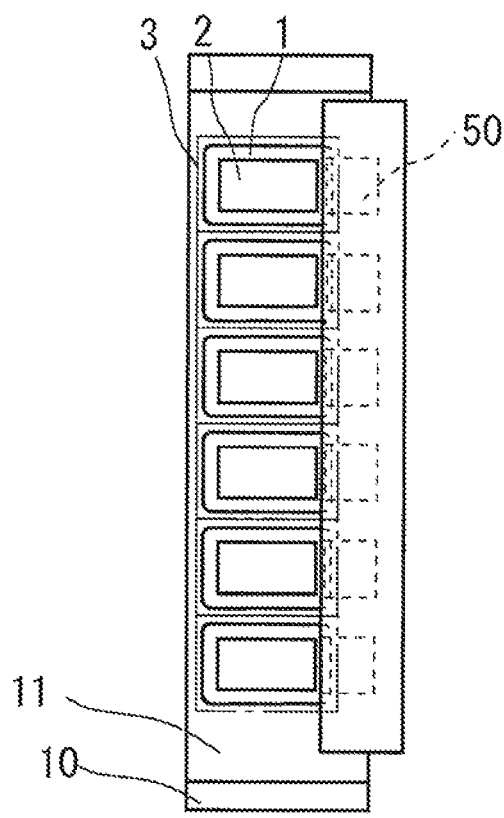
FIG. 8 is a view showing a process for connecting other electronic elements to the flexible electronic devices while holding on the cut (strip-shaped) glass substrate.

Next, a first modification of the above-mentioned method for manufacturing flexible electronic devices is described. In the first modification, as shown in FIG. 7, it is configured that third laser beams 43 for cutting off are irradiated by linearly scanning a third laser apparatus 43 in the first direction (X direction) to the glass substrate 10 and the resin film substrate 11 in a manner so that one row or two rows of the device formation areas 3 arranged in the first direction (X direction) among the device formation areas 3 arranged in the matrix shape are included in the same piece cut in the second direction (Y direction) prior to irradiation of the first laser beams 41 to the glass substrate 10 and the resin film substrate 11 or subsequent to irradiation of the first beams 41 and prior to irradiation of the second laser beams 42 from the back side of the glass substrate 10. For example, in the case that all of the flexible electronic devices 1 are arranged in the same direction, the third laser beams 43 are irradiated along the straight lines A and B shown by broken lines in FIG. 1. On the other hand, in the case that two adjoining flexible electronic devices 1 in the second direction (Y direction) are formed oppositely with respect to the straight lines B, for example, the third laser beams 43 are irradiated along only the straight lines A. Thereby, as shown in FIG. 8, it may be configured that other electronic elements such as driver ICs are connected to the flexible electronic devices 1 arranged in the first direction (X direction) on the glass substrate 10 by connecting flexible printed circuit boards 50 to the above-mentioned conductive patterns 4*d* (crimping and bonding using an anisotropic conductive film or the like) prior to irradiation of the second laser beams 42 from the back side of the glass substrate 10, and subsequently the second laser beams 42 are irradiated. In such a case, since the flexible electronic devices 1 are firmly held on the glass substrate 10, connecting operation of the flexible printed circuit boards or the like can be carried put effectively. By arranging the cut strip-shaped pieces are arranged to original state just after cutting off and fusion splicing the interfaces cut by third laser beams 43 under a state that low melting point glass frit materials are nipped between the cut surfaces, it is possible to reuse the glass substrate 10 as a large sized one, again. As the low melting point glass frit material, it is preferable to use a material having a melting point of about 600 to 800 degrees Celsius such as vanadium pentoxide ($V_2O_5$: melting point is about 650 degrees Celsius), which is higher than the maximum temperature (for example, ITT forming temperature of about 300 to 500 degrees Celsius) in the manufacturing process of the flexible electronic devices 1.

Figure 9A:
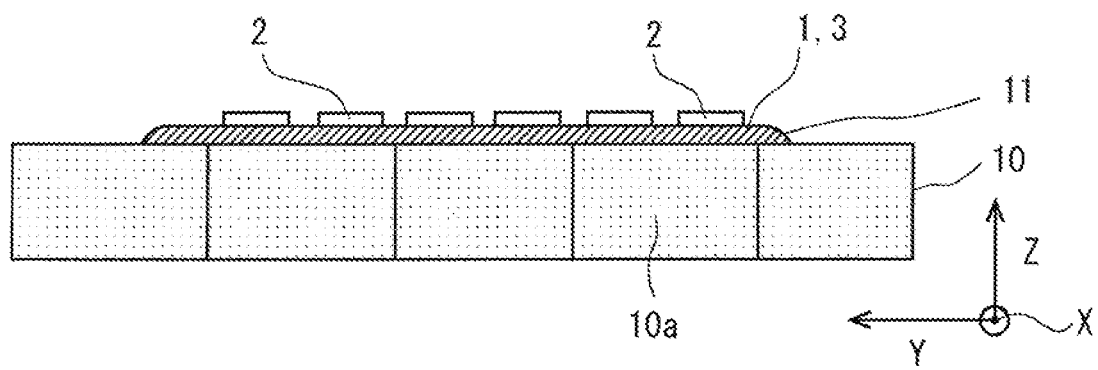
FIGS. 9A to 9C are views showing processes for cutting the resin film substrate in a manner so that device formation areas arranged in a first direction are cut into every other rows or every other two rows adjacent in the second direction by irradiating laser beams along bonding surfaces of a plurality of strip-shaped pieces which constitute the glass substrate in a second modification of the method for manufacturing flexible electronic devices.
Figure 9B:
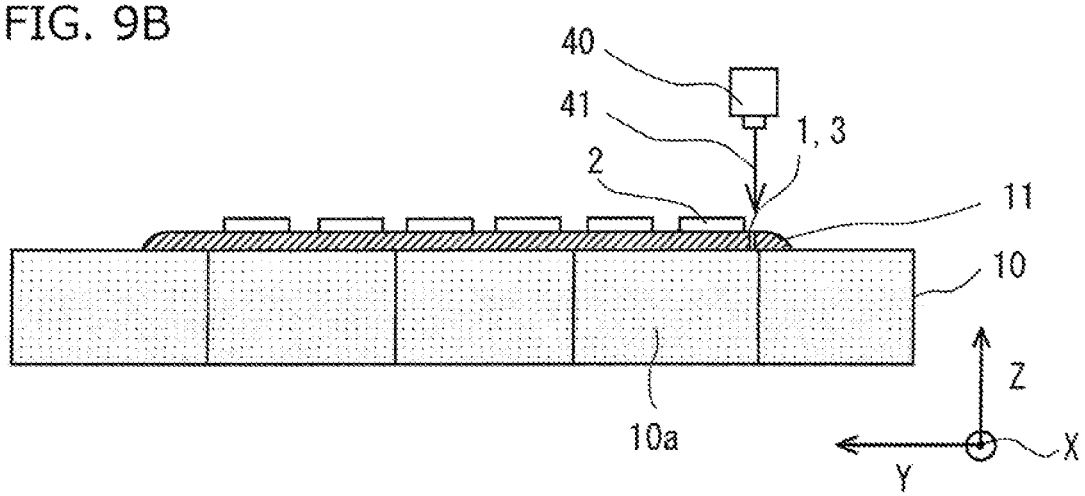
Figure 9C:
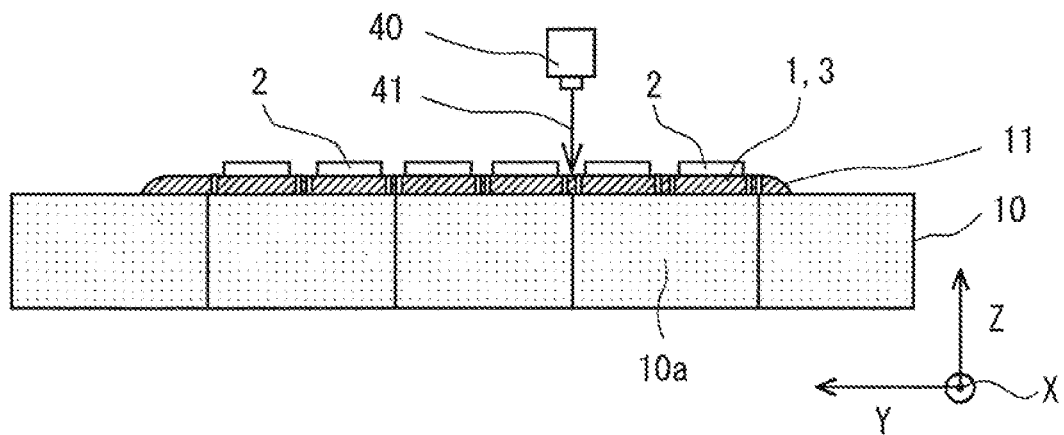

Next, a second modification of the above-mentioned method for manufacturing flexible electronic devices is described. In the above-mentioned first modification, the glass substrate 10 is cut off by irradiation of the third laser beams 43. However, in the second modification, as shown in FIGS. 9A to 9C, the glass substrate 10 is previously cut into the strip-shaped pieces 10*a* having certain dimensions corresponding to the sizes of the flexible electronic devices 1 to be manufactured, and a plurality of the strip-shaped pieces 10*a* is used by arranging them in the shorter side direction thereof. FIG. 9A shows a state that the electronic device structures 2 are formed on the resin film substrate 11 formed on the glass substrate 10. In the configuration shown in FIGS. 9A to 9C, the strip-shaped pieces 10*a* are respectively designed so that a dimension in the second direction (Y direction) is sufficient to form two device formation areas 3 (or flexible electronic devices 1) in the same direction, and a dimension in the first direction (X direction) is longer than the dimension in the second direction (Y direction). In addition, two flexible electronic devices 1 adjoining in the second direction (Y direction) are oppositely formed. FIG. 9B shows a state that the resin film substrate 11 is cut along the outer shape lines of the flexible electronic devices 1 while irradiating the first laser beams 41 to the device formation areas 3 by the first laser apparatus 40. In addition, FIG. 9C shows processes that all the flexible electronic devices 1 formed on the resin film substrate 11 are cut off from the resin film substrate 11 and the other areas, and subsequently, the first laser beams 41 are irradiated linearly in the first direction (X direction) along the contacting surfaces of two strip-shaped pieces 10*a* adjoining in the second direction (Y direction) or along a predetermined concave and convex pattern, so that the flexible electronic devices 1 arranged in the first direction (X direction) on the resin film substrate 11 are cut into every other adjoining two rows in the second direction (Y direction). According to the second modification, since the glass substrate 10 is previously cut into a plurality of the strip-shaped pieces 10*a*, it is possible to omit the process to cut off the glass substrate 10 by irradiation of the third laser beams 43. Besides, the dimension of the strip-shaped pieces 10a in the second direction (Y direction) is to be sufficient to form at least one row of the device formation areas 3 (or the flexible electronic devices 1) in the same direction. In such a case, the flexible electronic devices 1 arranged in the first direction (X direction) on the resin film substrate 11 may be cut off every other one row in the second direction (Y direction). In addition, in order to couple the adjoining two strip-shaped pieces 10a, concave and convex couplers in plain view may be formed at edge portions of the two strip-shaped pieces 10a in the second direction (Y direction). As for a method for manufacturing the strip-shaped, pieces 10a, it is conceived by irradiating the third laser beams 43 for cutting off by scanning the above-mentioned third laser apparatus 44 along a predetermined planer concave and convex pattern. As for the concave and convex pattern, it is preferable to have a shape which exerts anchor effect so as not to be separated even if any of the strip-shaped piece 10a is pulled in horizontal direction under a condition that a plurality of the strip-shaped pieces 10a are coupled.

As mentioned above, according to the method for manufacturing flexible electronic devices in the embodiment of the present invention, since the flexible electronic devices 1 formed in the device formation areas 3 are separated from the other areas by irradiating the first laser beams 41 having a longer wavelength such as infrared to the resin film substrate 11 prior to metamorphosing the interface between the glass substrate 10 and the resin film substrate 11 by irradiation of the second laser beams 42 having a shorter wavelength such as ultraviolet, for example, it is possible to connect other electronic elements such as driver ICs to the flexible electronic devices 1 while a plurality of the flexible electronic devices 1 are held on the glass substrate 10 putting the timing for irradiating the second laser beams 42 off. In addition, since the second laser beams 42 are irradiated to entire surface of the resin film substrate 11, the resin film substrate 11 can easily be removed from the glass substrate 10 and the glass substrate 10 can be reused. Furthermore, since the first laser beams 41 having a longer wavelength are irradiated along a rectangular shape having round corners 1a or chamfers 1b at four corners to each of the device formation areas 3, the four corners of the completed flexible electronic devices 1 are not sharpened, so that the possibility that the flexible electronic devices 1 are damaged or corners of them are not bent even if the flexible electronic devices 1 are brought into contact with each other is reduced.

Furthermore, by cutting the glass substrate 10 into the strip-shaped pieces 10a or by forming the glass substrate 10 by arranging a plurality of the strip-shaped pieces 10a which are previously cut and putting the timing for irradiating the second laser beams 42 off, the flexible electronic devices 1 can be treated under a state of being held on the glass substrate 10 or the strip-shaped pieces 10a, so that the flexible electronic devices 1 may not be brought into contact with each other, and thus, the possibility that the flexible electronic devices 1 are damaged or corners of them is reduced much more.

REFERENCE SIGNS LIST

1: Flexible electronic device
2: Electronic device structure
3: Device formation area
10: Glass substrate
10a: Strip-shaped piece
11: Resin film substrate
11a: Resin material
40: First laser apparatus
41: First laser beams
42: Second laser beams
43: Third laser beams
44: Third laser apparatus
50: Flexible printed circuit board

The invention claimed is:

1. A method for manufacturing flexible electronic devices comprising:
    forming a resin film substrate on a glass substrate by coating a thermosetting resin on a surface of the glass substrate and curing the thermosetting resin;
    forming electronic device structures in device formation areas, the device formation areas defined on the resin film substrate and arranged in a matrix having rows in a first direction and columns in a second direction;
    irradiating the resin film substrate with first laser beams having a first wavelength along rectangular shapes having round corners or chamfers formed at four corners to the device formation areas so as to cut the resin film substrate into pieces, each piece having one of the electronic device structures;
    irradiating second laser beams having a second wavelength from a side of the glass substrate where the resin film substrate is not formed so that the resin film substrate is peelable from the glass substrate;
    the second wavelength being less than the first wavelength; and
    irradiating the glass substrate and the resin film substrate with third laser beams so as to linearly cut the glass substrate and the resin film substrate in the first direction.

2. The method for manufacturing flexible electronic devices according to claim 1, wherein irradiating of the third laser beams is carried out prior to irradiation of the first laser beams or subsequent to irradiation of the first beams and prior to irradiation of the second laser beams.

3. The method for manufacturing flexible electronic devices according to claim 1, wherein the third laser beams are irradiated to cut off the glass substrate and the resin film substrate so that one row or two rows of the device formation areas arranged in the first direction are included in a same piece cut in the second direction.

4. The method for manufacturing flexible electronic devices according to claim 3, wherein irradiating of the third laser beams is carried out prior to irradiation of the first laser beams; the third laser beams are irradiated to cut the glass substrate into a plurality of strip-shaped pieces having a dimension in the second direction to accommodate one or two of the device formation areas in a same direction, and a dimension in the first direction is longer than a dimension in the second direction; and when irradiating the first laser beams, the first laser beams are linearly irradiated in the first direction along contact faces of two of the strip-shaped pieces adjacent to each other in the second direction.

5. The method for manufacturing flexible electronic devices according to claim 1, wherein the second laser beams are irradiated after electronic elements are respectively connected to the electronic device structures and every other row or every other two rows of the resin film substrate adjacent in the second direction are cut.

* * * * *